(12) United States Patent
Hakins et al.

(10) Patent No.: US 11,982,403 B2
(45) Date of Patent: May 14, 2024

(54) METHOD AND APPARATUS FOR IDENTIFYING WHEN AN INDIVIDUAL IS IN PROXIMITY TO AN OBJECT

(71) Applicants: David Hakins, Aldie, VA (US); Mike Bertosh, Bethel Park, PA (US); Brian Dunkin, Pittsburgh, PA (US); Andrew Hard, Meridianville, AL (US)

(72) Inventors: David Hakins, Aldie, VA (US); Mike Bertosh, Bethel Park, PA (US); Brian Dunkin, Pittsburgh, PA (US); Andrew Hard, Meridianville, AL (US)

(73) Assignee: Strata Products Worldwide, LLC, Sandy Springs, GA (US)

( * ) Notice: Subject to any disclaimer, the term of this patent is extended or adjusted under 35 U.S.C. 154(b) by 0 days.

(21) Appl. No.: 16/685,619

(22) Filed: Nov. 15, 2019

(65) Prior Publication Data
US 2020/0080689 A1 Mar. 12, 2020

Related U.S. Application Data

(62) Division of application No. 15/603,106, filed on May 23, 2017, now Pat. No. 10,544,899.
(Continued)

(51) Int. Cl.
*G08B 5/36* (2006.01)
*F16P 3/14* (2006.01)
(Continued)

(52) U.S. Cl.
CPC ............... *F16P 3/147* (2013.01); *F16P 3/145* (2013.01); *F16P 3/148* (2013.01); *G01V 3/10* (2013.01);
(Continued)

(58) Field of Classification Search
CPC .. F16P 3/147; F16P 3/145; F16P 3/148; F16P 3/12; F16P 3/00; G08B 3/10; G08B 21/0213; G08B 3/36; G08B 5/36
See application file for complete search history.

(56) References Cited

U.S. PATENT DOCUMENTS

| 4,213,122 A * | 7/1980 | Rotman | ............. G08B 13/2497 |
| | | | 340/552 |
| 4,719,363 A * | 1/1988 | Gallacher | ............ H05B 47/105 |
| | | | 307/117 |

(Continued)

*Primary Examiner* — Hoi C Lau
(74) *Attorney, Agent, or Firm* — Ansel M. Schwartz (57) ABSTRACT

An apparatus for identifying when an individual is in proximity to an object having a length has a sensor portion having a wire loop through which electric current runs and creates an electromagnetic field that emanates about the wire loop. The wire loop extending along at least a third of the length of the object. The apparatus has a personal alarm device that is worn by the individual which detects the presence of the magnetic field emanating from the wire loop when the personal alarm device is in the magnetic field and produces a signal indicating the personal alarm device is within the magnetic field. Alternatively, the sensor portion extends from a contiguous boundary up to 500 meters, where the boundary has a geometry that is linear or meandering. A head piece for an individual's head. A method for identifying when an individual is in proximity to an object. A field extension module. A proximity device.

11 Claims, 6 Drawing Sheets

Related U.S. Application Data (60) Provisional application No. 62/344,153, filed on Jun. 1, 2016.

(51) Int. Cl.
| | | |
|---|---|---|
| *G01V 3/10* | (2006.01) | |
| *G08B 3/10* | (2006.01) | |
| *G08B 13/24* | (2006.01) | |
| *G08B 21/02* | (2006.01) | |
| *H03K 17/95* | (2006.01) | |
| *H03K 17/955* | (2006.01) | |

(52) U.S. Cl.
CPC .................. *G08B 3/10* (2013.01); *G08B 5/36* (2013.01); *G08B 13/2414* (2013.01); *G08B 21/02* (2013.01); *H03K 17/9525* (2013.01); *H03K 2017/9527* (2013.01); *H03K 17/955* (2013.01)

(56) References Cited

U.S. PATENT DOCUMENTS

| | | | | |
|---|---|---|---|---|
| 5,126,749 | A * | 6/1992 | Kaltner | G08B 13/2474 340/572.7 |
| 5,408,086 | A * | 4/1995 | Morris | G02B 23/125 250/214 VT |
| 7,266,446 | B1 * | 9/2007 | Pelosi | G01C 1/00 340/980 |
| 8,047,161 | B2 * | 11/2011 | Moore | A01K 15/023 119/721 |
| 8,248,263 | B2 * | 8/2012 | Shervey | F16P 3/147 340/539.1 |
| 8,710,979 | B2 * | 4/2014 | Frederick | G08B 21/0213 340/539.11 |
| 8,786,447 | B1 * | 7/2014 | Wise | G01R 19/155 340/662 |
| 9,096,174 | B1 * | 8/2015 | Banks | B60Q 1/34 |
| 9,280,885 | B2 * | 3/2016 | Frederick | G08B 13/26 |
| 9,769,557 | B2 * | 9/2017 | Sindia | H04R 1/1041 |
| 9,836,941 | B2 * | 12/2017 | Mendiola | F16P 3/14 |
| 9,898,930 | B2 * | 2/2018 | Frederick | F16P 3/14 |
| 10,254,427 | B2 * | 4/2019 | Adachi | G01V 3/108 |
| 10,390,123 | B2 * | 8/2019 | Sindia | H03G 3/3005 |
| 10,544,899 | B2 * | 1/2020 | Hakins | F16P 3/145 |
| 2002/0154032 | A1 * | 10/2002 | Hilliard | G08G 1/042 340/933 |
| 2004/0239507 | A1 * | 12/2004 | Neary | G08B 21/0202 340/573.4 |
| 2005/0046558 | A1 * | 3/2005 | Buenz | B60C 23/0428 340/445 |
| 2006/0066454 | A1 * | 3/2006 | Kuckes | G01V 3/08 340/854.1 |
| 2006/0087443 | A1 * | 4/2006 | Frederick | E21C 35/24 340/686.6 |
| 2007/0205893 | A1 * | 9/2007 | Mainini | G08B 13/126 340/565 |
| 2008/0018472 | A1 * | 1/2008 | Dasilva | G08B 25/016 340/572.4 |
| 2008/0191541 | A1 * | 8/2008 | Frederick | E21C 27/24 299/1.2 |
| 2009/0021244 | A1 * | 1/2009 | May | G01D 5/145 324/207.2 |
| 2009/0021365 | A1 * | 1/2009 | Hurwitz | A42B 3/0453 340/479 |
| 2009/0109049 | A1 * | 4/2009 | Frederick | F16P 3/14 340/686.6 |
| 2009/0243871 | A1 * | 10/2009 | Botting | A63B 24/0021 340/686.6 |
| 2009/0256715 | A1 * | 10/2009 | Frederick | G08B 29/20 340/686.6 |
| 2009/0258715 | A1 | 10/2009 | Frederick | |
| 2009/0322512 | A1 * | 12/2009 | Frederick | G08B 5/36 340/539.11 |
| 2010/0271214 | A1 * | 10/2010 | Frederick | F16P 3/147 340/600 |
| 2010/0289662 | A1 * | 11/2010 | Dasilva | F16P 3/147 340/686.6 |
| 2011/0227748 | A1 * | 9/2011 | Schaible | F16P 3/14 340/686.6 |
| 2012/0153740 | A1 * | 6/2012 | Soar | H02J 50/12 307/104 |
| 2012/0249318 | A1 * | 10/2012 | Frederick | G08B 29/20 340/435 |
| 2012/0268261 | A1 * | 10/2012 | Frederick | G08G 1/166 340/435 |
| 2013/0038320 | A1 * | 2/2013 | Frederick | G08B 21/22 324/207.13 |
| 2013/0063550 | A1 * | 3/2013 | Ritchey | G16H 40/63 348/36 |
| 2014/0057686 | A1 * | 2/2014 | McCaughey | H01Q 19/28 455/575.5 |
| 2014/0077961 | A1 * | 3/2014 | Frederick | G08B 13/1427 340/686.6 |
| 2014/0125488 | A1 * | 5/2014 | Frederick | G08B 21/0219 340/686.6 |
| 2014/0191869 | A1 * | 7/2014 | Frederick | F16P 3/145 340/551 |
| 2014/0259308 | A1 * | 9/2014 | Moss | A42B 3/0406 2/410 |
| 2014/0375445 | A1 * | 12/2014 | Frederick | G08B 21/0275 340/435 |
| 2015/0018045 | A1 * | 1/2015 | Cha | H04M 1/185 455/566 |
| 2015/0054621 | A1 * | 2/2015 | Lin | G06K 19/0717 340/10.1 |
| 2015/0317897 | A1 * | 11/2015 | Frederick | G08B 21/22 340/686.6 |
| 2015/0372371 | A1 * | 12/2015 | Lagnado | H01Q 1/22 343/720 |
| 2016/0073722 | A1 * | 3/2016 | Eustace | A42B 3/0466 340/539.13 |
| 2016/0086404 | A1 * | 3/2016 | Parthasarathy | G07C 9/00119 340/5.28 |
| 2016/0148026 | A1 * | 5/2016 | Grimaux | G06K 7/10366 340/10.1 |
| 2016/0280240 | A1 * | 9/2016 | Carlson | G01S 19/17 |
| 2017/0025016 | A1 * | 1/2017 | Frederick | F16P 3/145 |
| 2017/0243457 | A1 * | 8/2017 | Milbrand | G08B 21/02 |
| 2017/0350557 | A1 * | 12/2017 | Hakins | G08B 5/36 |
| 2017/0356596 | A1 * | 12/2017 | Frederick | H03K 17/9502 |
| 2018/0074144 | A1 * | 3/2018 | Dezorayev | A61B 6/4258 |
| 2020/0080689 | A1 * | 3/2020 | Hakins | G08B 5/36 |

* cited by examiner

METHOD AND APPARATUS FOR IDENTIFYING WHEN AN INDIVIDUAL IS IN PROXIMITY TO AN OBJECT

CROSS-REFERENCE TO RELATED APPLICATIONS

This is a divisional of U.S. patent application Ser. No. 15/603,106 filed May 23, 2017, which is a non-provisional of U.S. provisional patent application Ser. No. 62/344,153 filed Jun. 1, 2016, all of which are incorporated by reference herein.

FIELD OF THE INVENTION

The present invention is related to detecting when a person is in proximity to an object. More specifically, the present invention is related to detecting when a person is in proximity to an object using a wire loop to produce an electromagnetic field in regard to the object which is used to determine when the person is in proximity to the object.

BACKGROUND OF THE INVENTION

Safety to individuals is of paramount concern in any endeavor. There are situations where individuals may become preoccupied with a given task and do not realize when they may place themselves in a dangerous position by being too close to an object that has the capability of causing them bodily harm. One such example is a miner in a mine working near mining equipment that has moving components that could injure the minor if the minor becomes too close to the moving components.

Proximity detection systems are a way for an individual to be alerted to a dangerous situation when they become too close to an object that could cause them injury. Proximity detection systems typically use ferrite coils for producing an electromagnetic field that serves as a basis for the proximity detection system to alert an individual when they are in proximity to an object which could cause them injury. A ferrite coil has possible limitations in regard to the shape of the magnetic field that the ferrite coil produces. The present invention provides for an electromagnetic field whose shape can be varied and expanded as compared to a ferrite coil.

SUMMARY OF THE INVENTION

The present invention pertains to an apparatus for identifying when an individual is in proximity to an object having a length. The apparatus comprises a sensor portion having a wire loop through which electric current runs and creates an electromagnetic field that emanates about the wire loop. The wire loop extending along at least a third of the length of the object. The apparatus comprises a personal alarm device that is worn by the individual which detects the presence of the magnetic field emanating from the wire loop when the personal alarm device is in the magnetic field and produces a signal indicating the personal alarm device is within the magnetic field.

The present invention pertains to an apparatus for identifying when an individual is in proximity to an object having a length. The apparatus comprises a sensor portion that creates an electromagnetic field extending from a contiguous boundary up to 500 meters, where the boundary has a geometry that is linear or meandering. The apparatus comprises a personal alarm device that is worn by the individual which detects the presence of the magnetic field when the personal alarm device is in the magnetic field and produces a signal indicating the personal alarm device is within the magnetic field.

The present invention pertains to a head piece for an individual's head. The apparatus comprises a lamp which produces light that is worn on the individual's head. The apparatus comprises a personal alarm device coupled to the lamp which detects an electromagnetic field and produces a signal when the personal alarm device is within the magnetic field.

The present invention pertains to a method for identifying when an individual is in proximity to an object having a length. The method comprises the steps of creating with a sensor portion an electromagnetic field extending from a contiguous boundary up to 500 meters, where the boundary has a geometry that is linear or meandering. There is the step of detecting with a personal alarm device that is worn by the individual the presence of the magnetic field when the personal alarm device is in the magnetic field. There is the step of producing with the personal alarm device a signal indicating the personal alarm device is within the magnetic field.

The present invention pertains to a field extension module. The field extension module comprises a box having a first gland, second gland, third gland and fourth gland. The field extension module comprises a ferrite coil disposed in the box. The field extension module comprises a spliced wire whose first end extends through the first gland and is attached to a first end of the ferrite coil, and whose other end extends through the second gland and attaches to the second end of the ferrite coil. An inward bound run of the wire attached to the second end of the ferrite coil bends around and extends and passes through the third gland and the fourth gland of the box.

The present invention pertains to a proximity device for attachment to an object having a length of at least 30 m. The device comprises a field generator having a power source for producing current and a capacitor bank in electrical communication with the power source to cause the current to resonate. The device comprises a wire loop which is at least 80% linear without any coiling electrically connected to the field generator which receives the current from the field generator and produces an electromagnetic field that is linear or meandering and has a contiguous boundary at least 30 m in length about the object when attached to the object.

DESCRIPTION OF THE INVENTION

Figure 1:
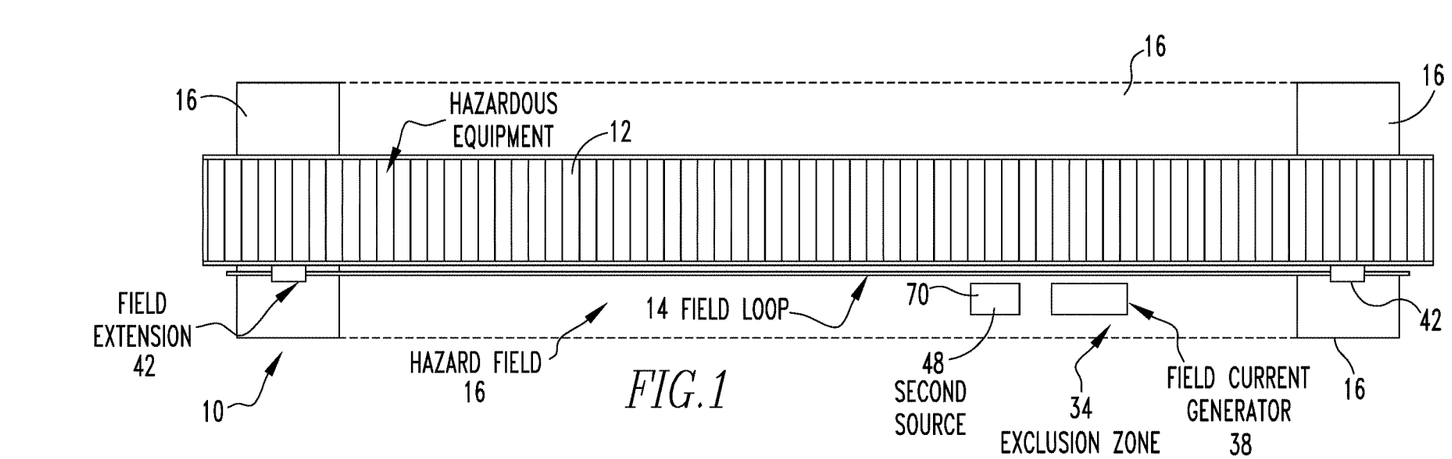
FIG. 1 is a schematic representation of the apparatus of the present invention.
Figure 5:
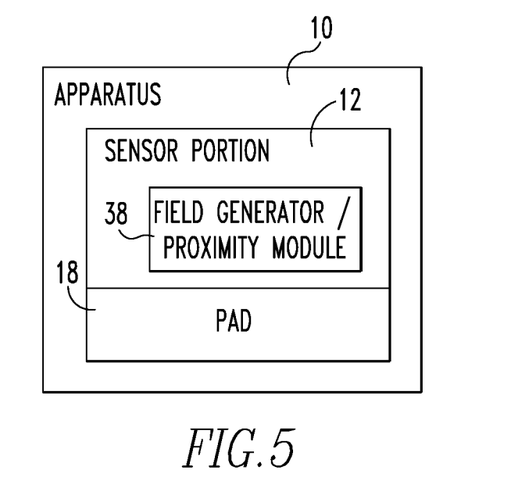
FIG. 5 is a block diagram of the apparatus.

Referring now to the drawings wherein like reference numerals refer to similar or identical parts throughout the several views, and more specifically to FIGS. 1 and 5, there is shown an apparatus 10 for identifying when an individual is in proximity to an object 12 having a length. The apparatus 10 comprises a sensor portion 12 having a wire 20 loop 14 through which electric current runs and creates an electromagnetic field 16 that emanates about the wire 20 loop 14. The wire 20 loop 14 extending along at least a third of the length of the object 12. The apparatus 10 comprises a personal alarm device 18 that is worn by the individual which detects the presence of the magnetic field 16 emanating from the wire 20 loop 14 when the personal alarm device 18 is in the magnetic field 16 and produces a signal indicating the personal alarm device 18 is within the magnetic field 16.

The present invention pertains to and apparatus 10 for identifying when an individual is in proximity to an object 12 having a length. The apparatus 10 comprises a sensor portion 12 that creates an electromagnetic field 16 extending from a contiguous boundary up to 500 meters, where the boundary has a geometry that is linear or meandering. The apparatus 10 comprises a personal alarm device 18 that is worn by the individual which detects the presence of the magnetic field 16 when the personal alarm device 18 is in the magnetic field 16 and produces a signal indicating the personal alarm device 18 is within the magnetic field 16.

Figure 9:
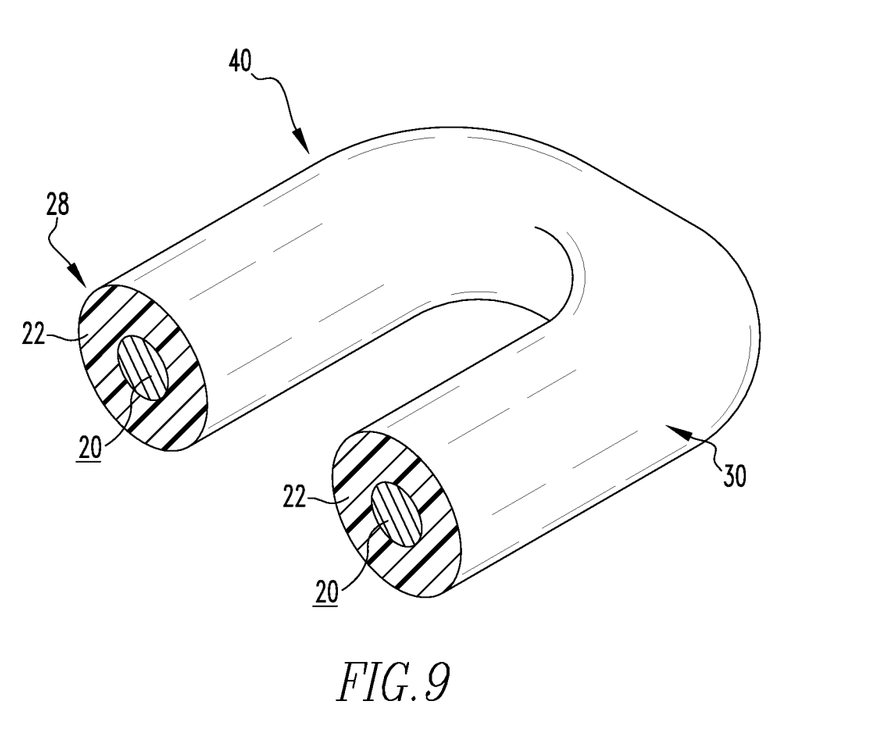
FIG. 9 shows a cross-section of the cable of the wire loop which has been bent back.

The sensor portion 12 may include a field generator 38 which provides current to the wire 20 loop 14, and wherein the wire 20 loop 14 may be a cable 40 with insulation 22 disposed about the wire 20 which bends back to create opposing wires with an outgoing wire 20 extending from the field generator 38 and an incoming wire 20 which extends to the field generator 38 from where the cable 40 bends back, as shown in FIG. 9. The wire 20 of the cable 40 has a first end and a second end electrically connected to the field generator 38.

Figure 6:
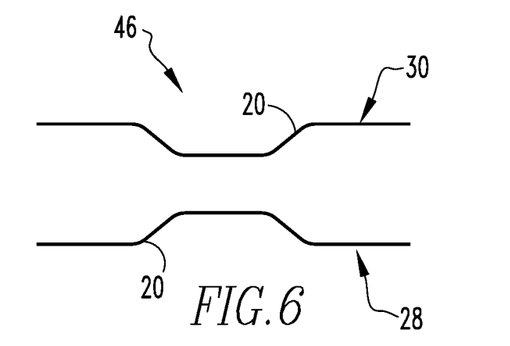
FIG. 6 shows a first portion of the loop.
Figure 7:
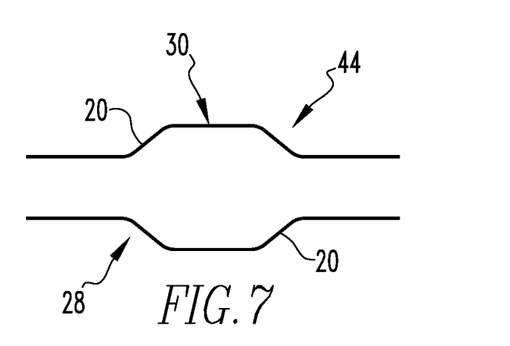
FIG. 7 shows a second portion of the loop.

The wire 20 loop 14 may itself be at least 80% linear without any coiling. The apparatus 10 may include a field extension module 42 which varies the field shape. A first portion 44 of the wire 20 loop 14, as shown in FIG. 7, may have the opposing wires of the cable 40 spaced further apart than a space between wires of another portion of the wire 20 loop 14 to increase the field reach. A second portion 46 of the wire 20 loop 14, as shown in FIG. 6, may have the opposing wires of the cable 40 spaced closer together than the space between wires of the other portion of the wire 20 loop 14 to decrease the field reach. The sensor portion 12 may include a capacitor bank 24 which matches an inductance of the wire 20 loop 14.

The apparatus 10 may include an exclusion zone 34 where the field is effectively negated so the PAD 18 does not produce an alarm in the exclusion zone 34. The apparatus 10 may include a second field source 48 which produces pulses that are at least 5 ms longer than pulses from the wire 20 loop 14 produced by the field generator 38. The PAD 18 detects the pulses and determines the PAD 18 is in the exclusion zone 34 when the longer pulses of the second field source 48 are detected.

Figure 8:
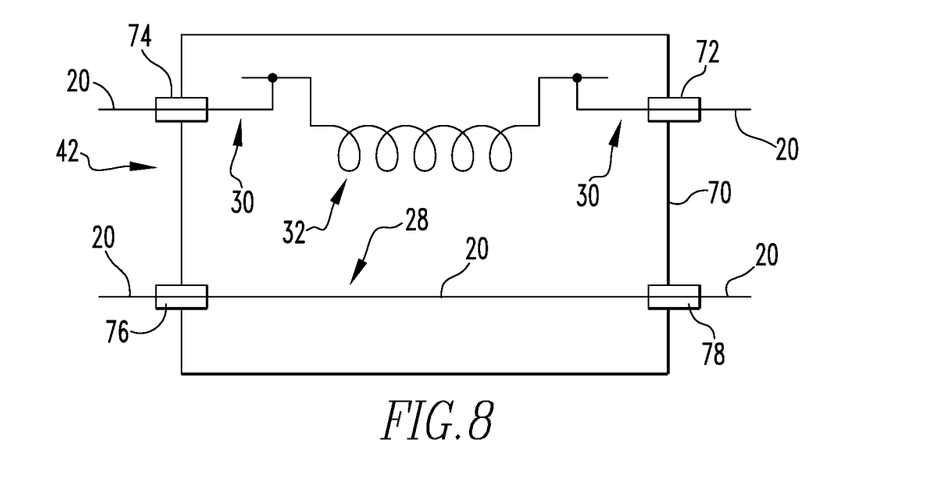
FIG. 8 is a representation of a field extension module.

The present invention pertains to a field extension module 42, as shown in FIG. 8. The field extension module 42 comprises a box 70 having a first gland 72, second gland 74, third gland 76 and fourth gland 78. The field extension module 42 comprises a ferrite coil 32 disposed in the box 70. The field extension module 42 comprises a spliced wire 20 whose first end extends through the first gland 72 and is attached to a first end of the ferrite coil 32, and whose other end extends through the second gland 74 and attaches to the second end of the ferrite coil 32. An inward bound run of the wire 20 attached to the second end of the ferrite coil 32 bends around and extends and passes through the third gland 76 and the fourth gland 78 of the box 70.

Figure 3:
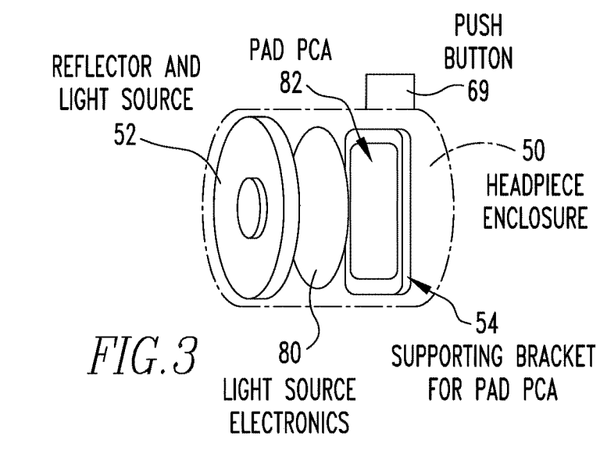
FIG. 3 is a schematic representation of a headpiece of the present invention.
Figure 11:
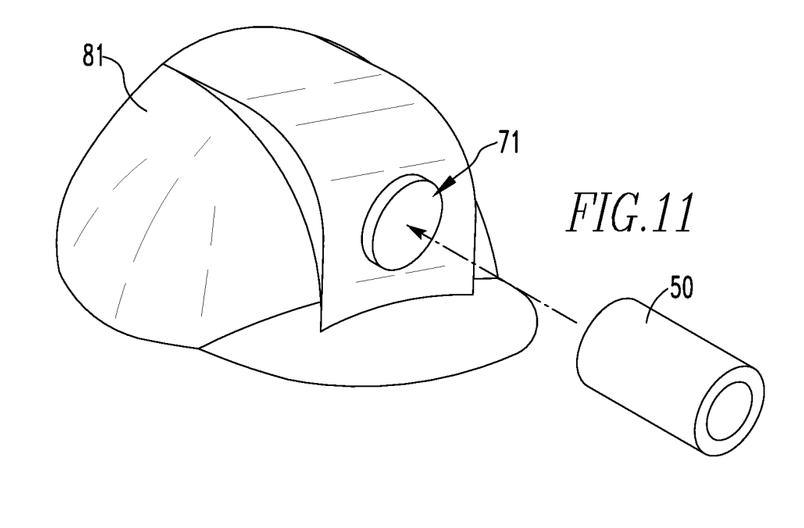
FIG. 11 shows a miner helmet.

The present invention pertains to a head piece 50 for an individual's head, as shown in FIGS. 3 and 11. The apparatus 10 comprises a lamp 52 which produces light that is worn on the individual's head. The apparatus 10 comprises a personal alarm device 18 coupled to the lamp 52 which detects an electromagnetic field 16 and produces a signal when the personal alarm device 18 is within the magnetic field 16. The head piece 50 may include a bracket 54 which holds the personal alarm device 18.

The present invention pertains to a method for identifying when an individual is in proximity to an object 12 having a length. The method comprises the steps of creating with a sensor portion 12 an electromagnetic field 16 extending from a contiguous boundary up to 500 meters, where the boundary has a geometry that is linear or meandering. There is the step of detecting with a personal alarm device 18 that is worn by the individual the presence of the magnetic field 16 when the personal alarm device 18 is in the magnetic field 16. There is the step of producing with the personal alarm device 18 a signal indicating the personal alarm device 18 is within the magnetic field 16.

Figure 12:
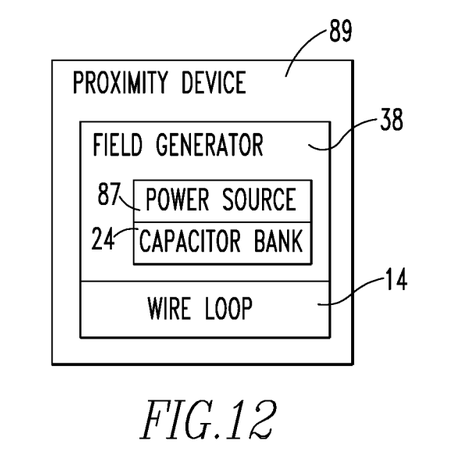
FIG. 12 is a block diagram of a proximity device.

The present invention pertains to a proximity device 89 for attachment to an object 12 having a length of at least 30 m, as shown in FIG. 12. The device 89 comprises a field generator 38 having a power source 87 for producing current and a capacitor bank 24 in electrical communication with the power source 87 to cause the current to resonate. The device 89 comprises a wire loop 14 which is at least 80% linear without any coiling electrically connected to the field generator 38, which receives the current from the field generator 38 and produces an electromagnetic field 16 that is linear or meandering and has a contiguous boundary at least 30 m in length about the object when attached to the object.

In the operation of the invention, an underground proximity system includes the following primary components:
Magnetic Field Generator 38
Controller
Display Tracking Pod
Personal Alarm Device (PAD 18)

The magnetic field generator 38 is mounted on mining machines to produce electromagnetic fields around the machine. These fields (also called zones) are used to delineate the borders of hazardous work areas. A magnetic field generator 38 comprises a microprocessor circuit and a UHF data radio receiver (869 or 916 MHz) that acquires status information from all PADs 18 within marker zones. The magnetic field generator 38 marker field frequency is typically 73 kHz, the optimal frequency for magnetic fields used in this application. The size of the marker field is based on the amount of energy input.

Workers-on-foot wear a Personal Alarm Device (PAD 18) that detects the magnetic field 16. There are repeated exchanges of information between the PAD 18 and the magnetic field generator 38 to ensure that the field strengths are sensed correctly.

The UHF radio receiver in the magnetic field generator 38 can also collect information about PAD IDs, battery usage, module status, etc. This information is stored for record keeping functions. The magnetic field generator 38 generates a marker field 16 using the loop 14. The size can be adjusted as needed.

The marker can be used in a layering arrangement. These layers are called zones: Monitor, ID, Warning 1, Warning 2 and Hazard. Some available zones are transparent to the user, in that the user does not receive feedback by alarm that they are in these zones. The Monitor and ID Zones are used to define the range of the marker field and radio signals, log miner IDs and perform other record keeping functions.

Zones that produce an alarm when entered include the Warning and Hazard Zones. The Warning Zone alarms to notify the user that they are nearing a potentially hazardous area. The Hazard Zone alarms when a worker-on-foot enters the innermost zone, which encompasses the most hazardous area around the machine. When the magnetic field generator 38 is installed, care is taken to select an area of the machine that minimizes the likelihood that the magnetic field generator 38 is subjected to mechanical abuse or high levels of electrical noise. One or more field generators 38, each with a loop 14, or at least one loop 14 and one ferrite coil 32 can be used.

The Controller coordinates the interaction of multiple magnetic field generators 38, provides a connection to a Display Tracking Pod, and provides access to select vehicle system status and control devices. All system modules are powered from the Controller, which in turn typically receives power from the machine with which it is interfaced. Responses from any PAD 18 that are received by any generator 38 are transmitted to the controller, where the appropriate discrete is turned off or on (Remote Stop, Stop or Warning). If properly interfaced, the system may also be used to slow or stop the functions of the machine.

Visual status and event data resulting from these communications and decisions are displayed on a Display Tracking Pod. This data is also logged in memory so that it can be downloaded to evaluate safety functions and events. The Display Tracking Pod is typically positioned near the machine operator's work location.

Any system can have a Display Tracking Pod installed to inform the operator of the status of the system and alert the operator if any users are within the Warning Zone or the Hazard Zone. The alerts are conveyed by the LED lights within the Pod.

The PAD 18 is worn by workers-on-foot to detect the close proximity of a vehicle or machine that is equipped with the proximity device 89. The PAD 18 will emit both audible and visual alarms for the user, as well as alert the machine operator to the user's presence. The PAD 18 is charged after each shift with an external battery charger.

FIG. 1 shows an apparatus 10 which creates an AC magnetic field 16, which in turn is detected and whose intensity is measured using mutual inductance. The magnetic field 16 extends from a contiguous boundary that may be up to 500 meters in length, where the boundary has a geometry that is linear or meandering. The contiguous boundary can be much shorter, for instance 10 m, 20 m, 30 m, 40 m or even 50 m, or multiples thereof, if desired. The current source for the magnetic field 16 uses the same printed circuit assembly used in the Strata surface and hardrock proximity field generator 38 (a.k.a. Proximity Module). A purposely designed and assembled wire 20 loop 14 is used to affect the magnetic field 16 rather than the ferrite core coil typically used in the Proximity Module. This off-the-shelf Proximity System available from Strata Products Worldwide, LLC, has the 2 ends of the wire 20 loop 14 connected to the printed circuit assembly of the Proximity Module in exactly the same way as the 2 ends of the ferrite core coil 32 is otherwise connected to the PCB, except that the wire 20 loop 14 now replaces the ferrite core coil 32.

The wire 20 loop 14 is assembled to create a two conductor cable 40 assembly in which the two conductors are kept a constant distance from each other throughout most if not all of the run. The wire 20 loop 14 can be one continuous wire 20 that folds back on itself or defines a bend, as shown in FIG. 9, to create the 2 wires alongside each other, with one side extending from the printed circuit assembly and the return extending back to the printed circuit assembly of the Proximity Module/field generator 38. This separation distance is maintained by inserting a non-metallic component between the two conductors. One example of a wire 20 loop 14 can be a commercially available SOOW power cable 40 with the insulation 22 surrounding the conductor serving as the spacer maintaining the spacing of the wires apart when the power cable 40 is folded back on itself and the 2 ends attached to the printed circuit assembly in the same way as the ferrite coil 32 was attached to the printed circuit assembly, which the cable 40 replaces. The distance may range from 5 to 50 mm. From the cable 40 there is produced a field of cylindrical geometry. Each conductor of the wire 20 loop 14 is itself generally at least 80% linear without any coiling.

At certain points in the cable 40 run, field extension modules 42 are introduced to provide spaces where the field is extended beyond the otherwise cylindrical field shape. The field extension modules 42 may consist of a ferrite coil 32, as shown in FIG. 8, or portions in the cable 40 assembly in which the distance between the two conductors is extended for a limited length portion of the cable 40 run, as shown in FIG. 7. Alternatively, the two conductors may be brought closer together for a portion of the cable 40 run to reduce the reach of the field in certain spaces, as shown in FIG. 6.

When a ferrite coil 32 is used in the field extension module 42, the outward bound run of the wire 20 is spliced and inserted through a first gland 72 of, for instance a fiberglass box 70 that houses the ferrite coil 32. The end of the wire 20 which extends through the first gland 72 is then attached to a first end of the ferrite coil 32 in the box 70. The other free end of the spliced wire 20 is inserted through a second gland 74 of the box 70, typically in the opposing side of the box 70 from the side with the first gland 72, and attached to the other end of the ferrite coil 32 in the box 70. The inward bound run of the wire 20 extends and passes through a third and a fourth gland 78 in the box 70. Alternatively, as mentioned above, instead of a ferrite coil 32 being used, the distance between the inward bound wire 28 and the outward bound wire 30 can be changed to achieve the desired field configuration. In addition, it should be noted that by changing the current running through the wire 20 loop 14, the field range is changed, so by increasing or decreasing the current running through the wire 20 loop 14, increases or decreases how far the field extends from the wire 20 loop 14.

The current used to create the magnetic field 16 is generated using a resonant or direct drive mechanism from a purposely built printed circuit assembly. For example, the commercially available Strata Proximity Module's primary PCA 36 may be used to provide a resonant drive. Allowing the current to resonate requires a matching capacitor bank 24. This capacitor bank 24 may be installed on the PCA 36 or located separately from the PCA 36. The capacitor bank 24 is adjustable, allowing it to be used with any length of field loop 14 cable 40. The capacitor bank 24 may be self-adjusting to match the inductance of the field loop 14, using solid state switching as a control mechanism and peak voltage detection as a means for implementing a control loop 14. When solid state switching is employed, a voltage feedback signal is provided to the Proximity Module PCA 36. The feedback signal allows the processor on the Proximity Module PCA 36 to measure the performance of the circuit. The processor calculates the optimal switch settings to maximize the current output, allowing the circuit to resonate.

Figure 2:
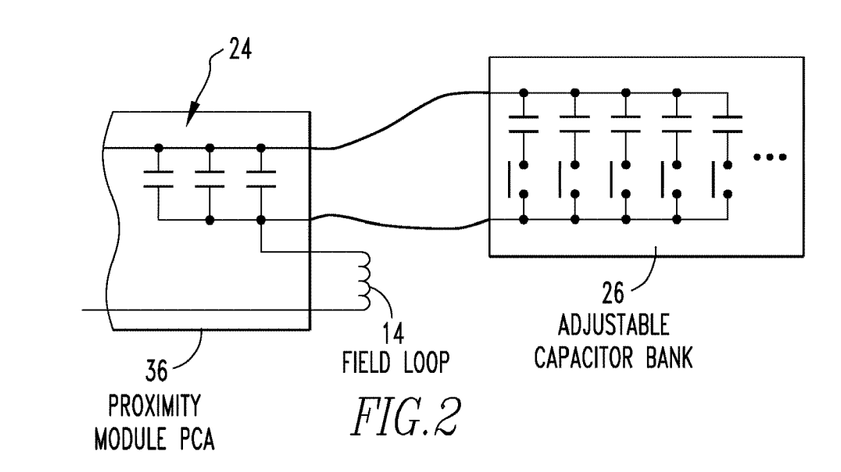
FIG. 2 is a schematic representation of an added capacitor bank to a proximity module.

A second printed circuit assembly is electrically connected to the existing capacitor bank 24 already present in the Strata Proximity Module. The additional second printed circuit assembly serves to expand the capability of the already present capacitor bank 24 and to allow the capacitor bank 24 to be adjusted as necessary to create the desired field that is produced by this apparatus 10 and match the inductance of the field loop 14. The advantage and purpose of this additional second printed circuit assembly is that commonly the necessary inductance for the apparatus 10 is unknown until the apparatus 10 is installed. Once the installation is complete, and the inductance is known, the capacitor bank 24 is then adjusted to yield the necessary inductance. That is, the capacitor bank 24 allows the installer to adjust the resonant frequency of the tunable circuit (i.e. the field loop 14 coupled with the capacitors). This is necessary because each installation of the field loop 14 may have a different inductance based on the length of the cable 40, added field extensions, and proximity to other objects such as the frame of continuous haulage. See FIG. 2, which shows the capacitor bank 24 electrically connected with the field loop 14 and the proximity module PCA 36. The capacitor bank 24 can be adjusted by utilizing the desired additional amount of capacitance necessary, either automatically as described above, or manually by connecting wiring to the appropriate location to utilize the necessary amount of capacitance of the capacitor bank 24. One skilled in the art knows how to manually wire the additional capacitor bank 24 to utilize the additional capacitor bank 24 as necessary.

At any point in the field shape, an exclusion zone 34 may be placed in which the hazard field is effectively negated for a defined volume of space. This field is affected through the use of a separate field with different modulation characteristics. (This is the Silent Zone field.)

For a mineveyor installation, a MPC, or Mineveyor Proximity Controller (MPC) is fastened to the outside frame of each mineveyor. The MPC houses the Proximity Module PCA 36, Interface Module, exclusion zone 34 wire 20 loop 14, visual indicators, and interface wiring to the mineveyor. The Proximity Module, such as the Strata Proximity Module, provides the current drive for the magnetic field 16, radio transceiver used to communicate with the Personal Alarm Devices (PADs) 18, and timing control. The Interface Module provides the system power supply, exclusion zone 34 generation, interfacing, event recording, and electronics control of the system. The three visual indicators on the front panel of the Mineveyor are used to communicate system operation status, presence of individual in the warning zone, and presence of individual in a hazard zone. The system is configured to provide a signal to the mineveyor, shutting down should an individual enter the hazard zone.

An example of an installation of the apparatus 10 is with a mobile conveyor system, which consists of 5 segments each about 50 feet long, used in an underground mine. The generating loop 14 is also 50 feet long to cover the length of the conveyor. A frequency of 73 kHz is used to drive the loop 14 and generate a relatively small field. The hazard zone is at most 4.5 feet from the cable 40 that houses the generating loop 14. A 10 AWG SOOW 3 conductor wire 20 is used for the cable 40, but only one of the three conductors of the cable 40 is used. The large diameter cable 40 is used to provide separation between the conductors in order to create a stable field. The loop 14 was attached to the side face of the machine with conduit clamps that are bolted to the I-beam structure of the conveyor. This I-beam structure is a long steel structure below and on the side of the belt of the conveyor. Only one capacitor bank 24 is needed per loop 14. The capacitor bank 24 is located inside the MPC enclosure (Mineveyor Proximity Controller). The inductance regarding the cable 40 of the apparatus 10 is approximately 20 uH and the capacitor bank 24 in the MPC, to which the cable 40 is an electrical communication, is configured for approximately 240 nF.

The Interface Module of the MPC also sources a signal used to provide a well-defined exclusion zone 34. This exclusion zone 34 is used to provide a 4 foot radius zone around the conveyor's control box 70, allowing personnel to access the control box 70 during normal operation without triggering an alarm. This combination of zones trains the user to approach the control box 70 (and mineveyor) from a 90 degree angle.

The exclusion zone 34 (a.k.a. silent zone) is created by sourcing current into a ferrite coil 32 operating at 130 microHenries, which is housed in a small enclosure outside of the MPC. This enclosure is connected only to the interface module in the MPC by using a short power cable run between the two boxes (as opposed to the loop 14 which is connected to the Proximity Module). The pulse width for the silent zone magnetic field 16 pulses is longer than those for the pulses for main loop 14. This is how the PAD 18 distinguishes between the two. The other variants of Strata proximity detection systems operate in the same fashion. For instance, the pulse from the loop 14 is 3 ms long followed by a 3 ms gap followed by a 3 ms pulse and then a 150 ms gap, after which the pattern repeats. The PAD 18 looks for this pattern, and when sensed, recognizes it is in a hazard zone and activates an alarm. In contrast, the ferrite coil 32 has associated with it a 16 ms pulse followed by a 150 to 250 ms gap, which overrides the pulse pattern of the loop 14, when sensed by the PAD 18. When the PAD 18 senses the 16 ms pulse, the PAD 18 recognizes it is in the silent zone and does not allow for the PAD 18 to generate an alarm from the pulse pattern of the loop 14. The same pulsing can be used if a separate loop 14 is present instead of a ferrite coil 32 for the exclusion zone.

Figure 4:
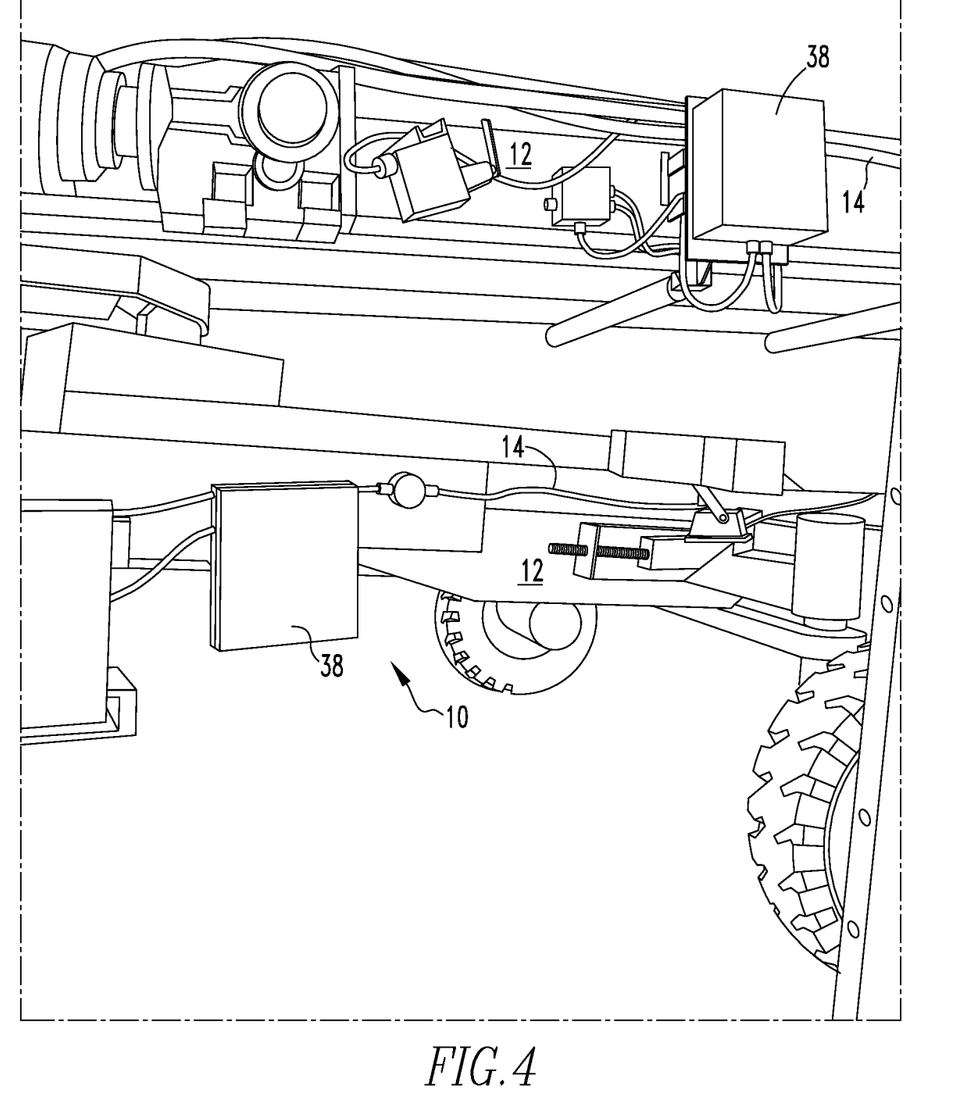
FIG. 4 shows the apparatus on a Minevayor.

FIG. 4 shows part of the installation. The silent zone box 70 cannot be seen though; it's to the left of the lower MPC.

Figure 13:
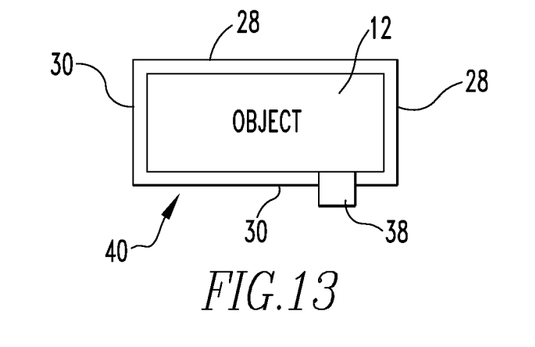
FIG. 13 is a schematic or a loop positioned about an object.

The wire loop 14 is not required to have the inward bound and outward bound wires alongside each other. For instance, as shown in FIG. 13, the wire loop 14 can be attached to the object 12, such as a mineveyor, by the cable 40 of the wire loop 14 being attached around the entire perimeter of the object 12. The outward bound wire 30 extends from the field generator 38 along a right side of the object, around the front of the object, then continues with the inward bound wire 28 extending around the left side of the object 12, along the back of the object and then connecting with the field generator 38. In this case, the wire loop 14 extends completely around the object with the mineveyor, if the object 12 is a mineveyor, between the inward bound and the outward bound wires of the loop 14. As mentioned above, by controlling the level of current, as well as how far apart the inward bound and outward bound portions of the cable 40 are with respect to each other, controls the electromagnetic field that extends from the cable 40.

If desired, one or more field extension modules 42 can be located in the cable 40 run of the loop 14. Referring to FIG. 1, there is shown two field extension modules 42, one to the right and one to the left of the field generator 38. There are two ways that these two field extension modules 42 can be supported by the field generator 38. In one embodiment, the outward bound wire 30 extends to the left along the perimeter of the object to the field extension module 42, where it extends through the field extension module 42 and then bends back so the inward bound wire 28 extends back through the field extension module 42, as described above and shown in FIG. 8, and then continues back to the field generator 38. However, in this embodiment, the cable 40 continues past the field generator 38, extends to the right to the other field extension module 42, where it passes through the other field extension module 42, bends again to return to the other field extension module 42, where the cable 40 is spliced, if a ferrite coil 32 is being used in the field extension module 42, connects to the ferrite coil 32, and then extends out of the other field extension module 42, as described above, and connects with the field generator 38, to complete the loop 14. If no ferrite coil 32 is used, then the wires of the loop 14 will instead be spread out or brought closer together in the field extension module 42, as described above and shown in FIGS. 6 and 7.

In the second embodiment, the field generator 38 will have two separate Proximity Modules instead of one, as is the case for the first embodiment. When there are two separate Proximity Modules in the field generator 38, each Proximity Module just supports one of the field extension modules 42, and there are two separate cables 40 used, and two separate wire loops 14 used. One cable 40 extends from one Proximity Module to the left to the field extension module 42 and back, as described above, in regard to the description of the field extension module 42, and the second cable 40 extends from the second Proximity Module in the field generator 38, to the right to the other field extension module 42 and back to the second Proximity Module of the field generator 38, to complete the second loop 14.

The PADs 18 are used to detect the presence, and measure the intensity of the generated magnetic field 16. The PADs 18 are integrated into a head lamp 52 of a head piece 50, as shown in FIG. 3. (The intent is to force the user to carry the protection device). The head lamp 52 incorporates a push-button 69 that is used by the user in a remote stop condition. When the push-button 69 is pressed, the PAD 18 communicates to all MPC's within RF range to forward a stop message to the MPC. The PAD 18 also monitors RF activity to detect the presence of a MPC, indicating to the user when a MPC is detected by way of an LED on the front bezel of the lamp 52. The PAD 18 will indicate a fault condition when a field is detected (regardless of intensity) and an RF signal from the MPC is not. (Indicating an RF fault). The head lamp 52, sometimes referred to as a cap lamp 52, has a bracket 54 that holds the coils 88 that sense the magnetic field 16 produced by the apparatus 10. The lamp 52 and the PAD 18 of the cap lamp 52 are powered from a battery located on a belt that the miner wears. The cap lamp 52 with belt supported battery and power cable 40 extending between the battery and the cap lamp 52 is commercially. This product is modified, as explained above with the bracket 54, to hold the coils 88 of the PAD 18. The head piece 50 fits into a slot of a standard helmet 81 worn by a miner, as shown in FIG. 11.

The headpiece enclosure includes a reflector and light source, light source electronics 80, electrically connected to the reflector and light source, PAD PCA 82 electrically connected to the light source electronics 80 and a supporting bracket 54 for the PAD PCA 82. The PAD PCA 82 includes all the necessary coils 88 and electronics that are found in a standard PAD PCA 82. Enclosed within the enclosure and in communication with the PAD PCA 82 is an antenna for communication with the Proximity Module to cause the object 12 to be turned off if the miner wearing the headpiece enclosure gets too close to the object 12 and enters the magnetic field 16 produced by the wire 20 loop 14, or ferrite coil 32, depending on what is present, where the magnetic field 16 strength is above a defined threshold.

In addition, the PAD PCA 82 receives power from the light source electronics 80, and also activates LEDs and alarms of the light source electronics 80 to inform the miner wearing the headpiece enclosure of the miner's status relative to the magnetic field 16.

Figure 10:
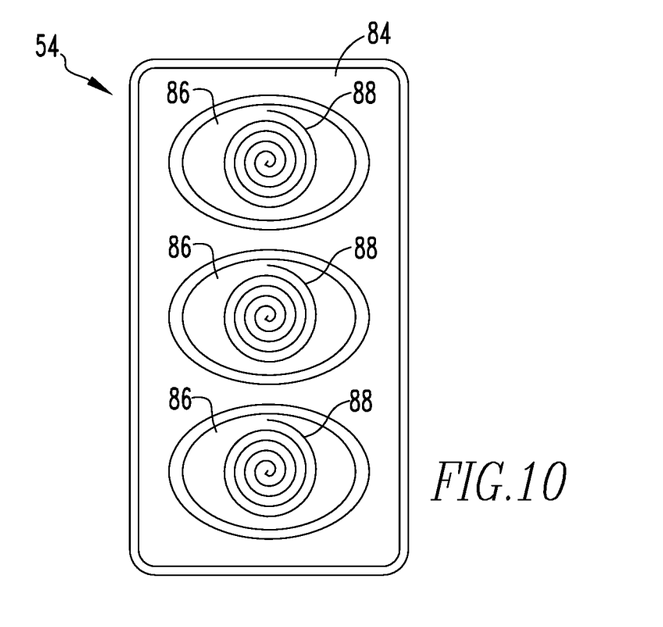
FIG. 10 shows a bracket of the head piece.

The bracket 54 has a large recess 84 that has three smaller defined recesses, with each smaller recess holding one of the three coils 88 of the PAD 18 that are used to engage with the magnetic field 16, as shown in FIG. 10. The large recess 84 with the three smaller defined recesses can be considered a tray with compartments, where the compartments hold the coils 88. The coils 88 are secured in place in the smaller recesses 86 with RTV.

The bracket 54 with the PAD 18 in the large recess 84 fits and essentially forms a sandwich with the printed circuit board that constitutes the light electronics, which in turn is alongside the reflector and the light source. This sandwich fits snugly into the headpiece so the sandwich does not move around inside the headpiece, without having to be bolted or attached to the headpiece.

Although the invention has been described in detail in the foregoing embodiments for the purpose of illustration, it is to be understood that such detail is solely for that purpose and that variations can be made therein by those skilled in the art without departing from the spirit and scope of the invention except as it may be described by the following claims.

The invention claimed is:

1. An apparatus for identifying when an individual is in proximity to an object having a length comprising:
   a sensor portion having a wire loop through which electric current runs and creates an electromagnetic field that emanates about the wire loop, the wire loop extending along at least a third of the length of the object, the sensor portion includes a field generator which provides current to the wire loop, and wherein the wire loop is a cable with insulation disposed about the wire which bends back to create opposing wires with an outgoing wire extending from the field generator and an incoming wire which extends to the field generator from where the cable bends back, the wire of the cable has a first end and a second end electrically connected to the field generator, a first portion of the wire loop has the opposing wires of the cable spaced further apart than a space between wires of another portion of the wire loop to increase the field reach;
   a personal alarm device that is worn by the individual which detects the presence of the magnetic field emanating from the wire loop when the personal alarm device is in the magnetic field and produces a signal indicating the personal alarm device is within the magnetic field; and
   a field extension module which varies the field shape.

2. The apparatus of claim 1 wherein the wire loop is itself at least 80% linear without any coiling.

3. The apparatus of claim 1 wherein a second portion of the wire loop has the opposing wires of the cable spaced closer together than the space between wires of the other portion of the wire loop to decrease the field reach.

4. The apparatus of claim 3 wherein the sensor portion includes a capacitor bank which matches an inductance of the wire loop.

5. The apparatus of claim 4 including an exclusion zone where the field is effectively negated so the PAD (personal alarm device) does not produce an alarm in the exclusion zone.

6. The apparatus of claim 5 including a second field source which produces pulses that are at least 5 ms longer than pulses from the wire loop produced by the field generator, the PAD detecting the pulses and determining the PAD is in the exclusion zone when the longer pulses of the second field source are detected.

7. The apparatus of claim 6 wherein the field shape is cylindrical extending along the loop length except where the field extension module is located.

8. An apparatus for identifying when an individual is in proximity to an object having a length comprising:
- a sensor portion that creates an electromagnetic field extending from a contiguous boundary up to 500 meters, where the boundary has a geometry that is linear or meandering, the sensor portion includes a field generator which provides current to the wire loop, and wherein the wire loop is a cable with insulation disposed about the wire which bends back to create opposing wires with an outgoing wire extending from the field generator and an incoming wire which extends to the field generator from where the cable bends back, the wire of the cable has a first end and a second end electrically connected to the field generator, a first portion of the wire loop has the opposing wires of the cable spaced further apart than a space between wires of another portion of the wire loop to increase the field reach;
- a personal alarm device that is worn by the individual which detects the presence of the magnetic field when the personal alarm device is in the magnetic field and produces a signal indicating the personal alarm device is within the magnetic field; and
- a field extension module which varies the field shape.

9. A head piece for an individual's head comprising:
- a helmet that is worn on the individual's head;
- a battery attached to the helmet;
- a lamp which is powered by the battery and which produces light that is attached to the helmet worn on the individual's head; and
- a personal alarm device attached to the helmet that is worn on the individual's head, coupled to the lamp attached to the helmet on the individual's head and receives power from the battery through the lamp, which detects an electromagnetic field and produces a signal when the personal alarm device is within the magnetic field, the personal alarm device having a recess in which is disposed a coil that engages with the magnetic field, the personal alarm device is integrated into the lamp as a single unitary structure.

10. The head piece of claim 9 including a bracket attached to the helmet which holds the personal alarm device.

11. The head piece of claim 10 wherein the single unitary structure is disposed in a slot of the helmet.

* * * * *